United States Patent
Sagara

(10) Patent No.: US 7,667,553 B2
(45) Date of Patent: Feb. 23, 2010

(54) FREQUENCY MODULATOR USING PLL

(75) Inventor: Takeshi Sagara, Kyoto (JP)

(73) Assignee: Rohm Co., Ltd. (JP)

(*) Notice: Subject to any disclaimer, the term of this patent is extended or adjusted under 35 U.S.C. 154(b) by 408 days.

(21) Appl. No.: 11/706,677

(22) Filed: Feb. 15, 2007

(65) Prior Publication Data

US 2007/0189370 A1 Aug. 16, 2007

(30) Foreign Application Priority Data

Feb. 15, 2006 (JP) .............................. 2006-038090

(51) Int. Cl.
*H03C 3/06* (2006.01)
(52) U.S. Cl. .......................... 332/127; 332/117; 381/3; 381/4; 381/16; 375/376; 455/260
(58) Field of Classification Search ................... 331/17, 331/16, 34, 177 R; 332/127, 117; 381/3, 381/4, 6, 16; 375/376; 455/260
See application file for complete search history.

(56) References Cited

U.S. PATENT DOCUMENTS 7,062,229 B2 * 6/2006 Dunworth et al. ............. 455/76

FOREIGN PATENT DOCUMENTS

| JP | 55-39417 A | 3/1980 |
|---|---|---|
| JP | 58-143631 A | 8/1983 |
| JP | 62-8607 A | 1/1987 |
| JP | 62-118615 A | 5/1987 |
| JP | 3-106104 A | 5/1991 |
| JP | 5-90840 A | 4/1993 |
| JP | 5-91543 A | 4/1993 |
| JP | 8-186445 A | 7/1996 |
| JP | 8-213901 A | 8/1996 |
| JP | 9-69729 | 3/1997 |
| JP | 2001-211071 A | 8/2001 |
| JP | 2006-33108 A | 2/2006 |

OTHER PUBLICATIONS

Japanese Office Action for Japanese Patent Application No. 2006-038090 mailed Jul. 7, 2009 with English translation.

* cited by examiner

*Primary Examiner*—Arnold Kinkead
(74) *Attorney, Agent, or Firm*—Cantor Colburn LLP

(57) ABSTRACT

In a frequency modulator, a VCO oscillates at a frequency according to a voltage applied to an input terminal. A divider divides an output signal of the VCO. A phase comparator compares the output of the divider with a reference clock signal and outputs a voltage corresponding to a phase difference. A loop filter is provided on a path leading from an output terminal of the phase comparator to the input terminal of the VCO, and the loop filter removes a high-frequency component of an output voltage of the phase comparator. A terminal for inputting a modulation signal is provided in the loop filter, separately from a terminal connected with the path leading from the output terminal of the phase comparator to the input terminal of the VCO.

7 Claims, 3 Drawing Sheets

FREQUENCY MODULATOR USING PLL

BACKGROUND OF THE INVENTION

1. Field of the Invention

The present invention relates to a direct-modulation type frequency modulator utilizing a PLL (Phase-Locked Loop).

2. Description of the Related Art

In the FM broadcasting or in-car audio systems, used is a frequency modulator which generates a frequency-modulated signal based on an audio signal (modulation signal) to be transmitted. For example, in Reference (1) listed in the following Related Art List, disclosed is a direct-modulation type frequency modulator in which a PLL is configured by a voltage-controlled oscillator (hereinafter referred to as VCO), a divider, a phase comparator and a loop filter, and the audio signal being a modulation signal is superimposed with an input signal of the VCO.

As disclosed in Reference (1), in the conventional direct-modulation frequency modulator a method is implemented in which the modulation signal is coupled by using a coupling capacitor or a resistor for voltage addition between the output terminal of the loop filter and the input terminal of the VCO.

Related Art List (1) Japanese Patent Application Laid-Open No. Hei09-69729.

However, since in the conventional practice the modulation signal is superimposed with the high-frequency signal using a coupling capacitor or a resistor, there is a problem that the impedance of the loop filter in the PLL affects the input signal which is the modulation signal. When the modulation signal is influenced by the loop filter, the high-frequency component of the modulation signal is attenuated. This causes the distortion in the signal, for example in cases where the audio signal is modulated. Also, there are cases where the signal output from the loop filter is leaked in the side of the circuit that generates the modulation signal. Further, since the coupling capacitor is required, the number of circuit components needed for a circuitry is increased.

SUMMARY OF THE INVENTION

The present invention has been made in view of the foregoing problems to be resolved, and a general purpose thereof is to provide a frequency modulator capable of preventing the effect of a loop filter in a PLL upon a modulation signal.

One embodiment of the present invention relates to a frequency modulator which performs frequency modulation based on a modulation signal which is an input signal and then outputs the frequency-modulated signal. This frequency modulator comprises: a voltage-controlled oscillator which oscillates at a frequency according to a voltage applied to an input terminal; a divider which divides an output signal of the voltage-controlled oscillator; a phase comparator which compares the output signal of the divider with a reference clock signal and outputs a voltage corresponding to a phase difference between the output signal thereof and the reference clock signal; and a loop filter, provided on a path leading from an output terminal of the phase comparator to the input terminal of the voltage-controlled oscillator, which removes a high-frequency component of an output voltage of the phase comparator. In the loop filter a terminal for inputting a modulation signal is provided separately from a terminal connected with the path leading from the output terminal of the phase comparator to the input terminal of the voltage-controlled oscillator.

The modulation signal is inputted to an input terminal, among terminals led from the loop filter, which is other than the terminals on a path leading from the output terminal of the phase comparator to the input terminal of the voltage-controlled oscillator. According to this embodiment, the high-frequency component of the output signal of the phase comparator is removed by the loop filter and at the same time the modulated signal is superimposed with the output signal of the phase comparator. As a result, the coupling capacitor required in the conventional practice is no longer necessary. Hence the number of circuit components required is reduced and the circuit area can be reduced.

The terminal provided for inputting the modulation signal may be a reference voltage terminal of the loop filter. The reference voltage terminal means, for example, a terminal which is usually connected to a ground terminal and a fixed voltage is to be applied to.

The loop filter may include a capacitor provided between the input terminal of the voltage-controlled oscillator and the reference voltage terminal. The loop filter may be a lag-lead filter. Also, the loop filter may include: a first capacitor one end of which is connected with a wire serving as a path between the output terminal of the phase comparator and the input terminal of the voltage-controlled oscillator and the other end of which is connected with the reference voltage terminal; and a second capacitor and a resistor provided in series on a path parallel to the first capacitor.

The modulated signal may be a stereo composite signal.

The frequency modulator may be integrated onto a single semiconductor substrate. "Being integrated" includes a case where all of circuit components are formed on a semiconductor substrate or a case where the main components of a circuit are integrated thereon. Note that part of resistors or capacitors used to adjust circuit constants may be provided externally to the semiconductor substrate. Integrating the frequency modulator into a single LSI can reduce the circuit area.

Another embodiment of the present invention relates to an FM transmitter utilizing any of the above-described frequency modulators. This FM transmitter circuit comprises: a stereo modulation unit which converts an audio signal to a stereo composite signal; the above-described frequency modulator which frequency-modulates the stereo composite signal, outputted from the stereo modulation unit, as a modulated signal; and an amplifier which amplifies a high-frequency signal outputted from the frequency modulator.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
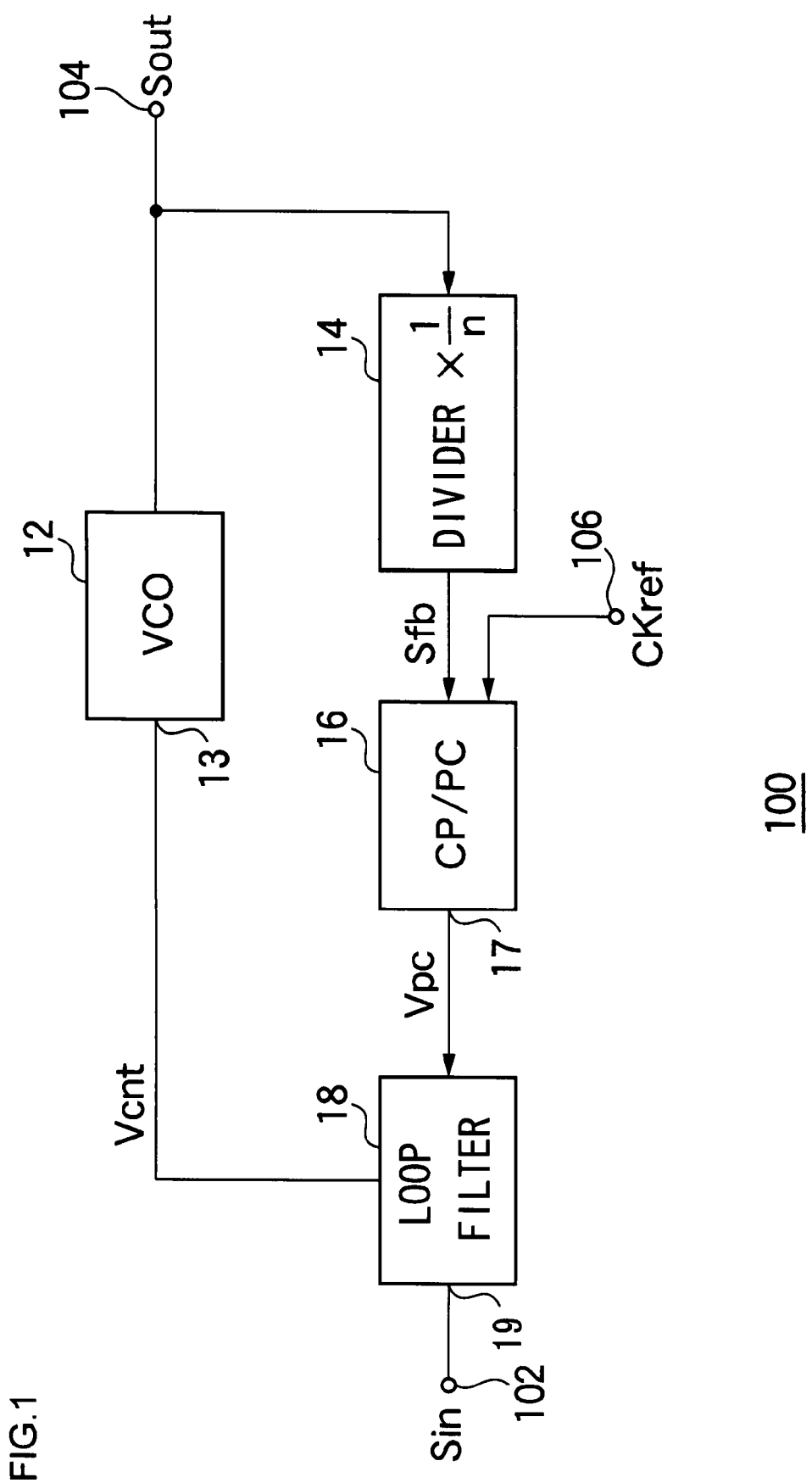
FIG. 1 is a circuit diagram showing a structure of a frequency modulator according to an embodiment of the present invention.

A frequency modulator according to the present embodiment constitutes a PLL using a VCO, a divider, a phase comparator and a loop filter. And this frequency modulator is a direct-modulation-type frequency modulator in which a modulated signal is superimposed with an input signal of the VCO. FIG. 1 is a circuit diagram showing a structure of a frequency modulator 100 according to an embodiment of the present invention. The frequency modulator 100 performs a frequency modulation based on an input signal Sin which is a modulation signal inputted to an input terminal 102, and then outputs a modulated signal Sout from an output terminal 104. A reference clock signal CKref is inputted to a reference clock terminal 106.

The frequency modulator 100 includes a VCO 12, a divider 14, a phase comparator 16 and a loop filter 18, all of which are integrated onto a single semiconductor substrate.

The VCO 12 oscillates at a frequency corresponding to the voltage (hereinafter referred to as control voltage Vcnt) applied to the input terminal 13 thereof. The output signal Sout of the VCO 12 is outputted externally from the output terminal 104 as a modulated signal, and it is also inputted to the divider 14.

The divider 14 divides the frequency frf of the output signal Sout of the VCO 12 into 1/n (n being a natural number) so as to output a feedback signal Sfb. The phase comparator 16 compares the feedback signal Sfb outputted from the divider 14 with the reference clock CKref inputted to the reference clock terminal 106, and then outputs a voltage corresponding to the phase difference between the two signals (hereinafter this voltage will be referred to as phase difference voltage Vpc). A phase comparator 16 of any configuration may be used. For example, the phase comparator may be configured by a phase comparator circuit which outputs a charge signal or discharge signal in response to a phase difference between the feedback signal Sfb and the reference clock signal CKref and a charge-pump circuit which charges/discharges the capacitance according to the charge signal or discharge signal.

The loop filter 18 is provided on a path leading from the output terminal 17 of the phase comparator 16 to the input terminal 13 of the VCO 12. The loop filter 18 removes the high-frequency component of phase difference voltage Vpc outputted from the phase comparator 16, so as to be outputted as a control voltage Vcnt.

There is provided a terminal 102 from the loop filter 18, separately from a terminal connected to the path leading from the output terminal 17 of the phase comparator 16 to the input terminal 13 of the VCO 12. This terminal 102 is the aforementioned input terminal 102, and the modulation signal Sin is inputted to this terminal 102.

Figure 2:
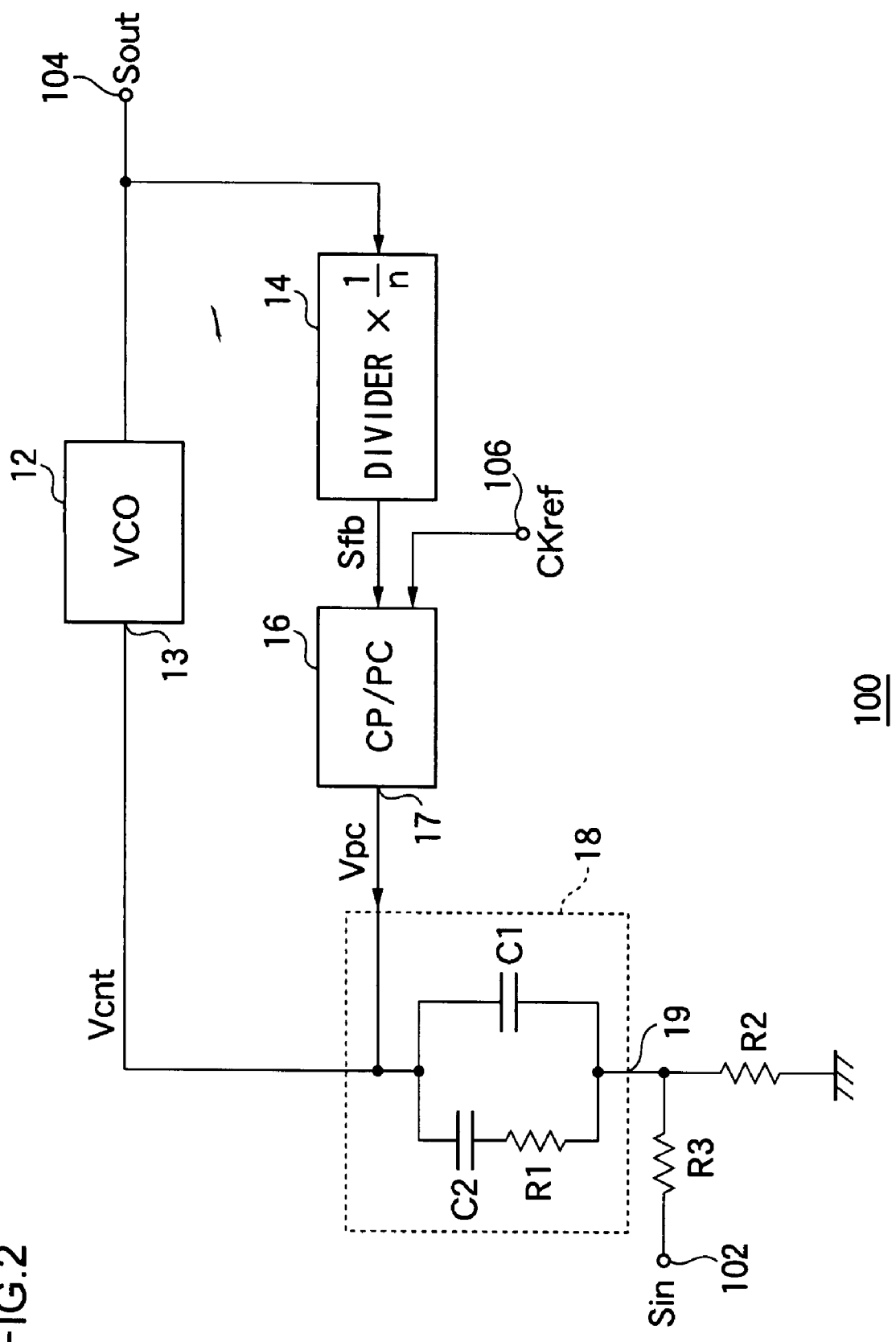
FIG. 2 is a circuit diagram showing a structure of a loop filter in the frequency modulator.

FIG. 2 is a circuit diagram of the frequency modulator 100 showing a detailed structure of the loop filter 18. In the present embodiment, in addition to shunt capacitors C1 and C2 branched out toward a reference voltage terminal 19 from a path leading from the output terminal 17 of the phase comparator 16 to the input terminal 13 of the VCO 12, the loop filter 18 includes a first resistor R1. One end of the first capacitor C1 is connected to a wire that forms a path for the output terminal 17 of the phase comparator 16 and the input terminal 13 of the VCO 12, and the other end of the first capacitor C1 is connected to the reference voltage terminal 19. The second capacitor C2 and the first resistor R1 are provided in series to each other on a path provided in parallel to the first capacitor C1. In this manner, according to the present embodiment, the loop filter 18 is configured as a lag-lead filter.

Normally, the loop filter 18 is used under a condition where the reference voltage terminal 19 is grounded and the potentials are fixed. In the present embodiment, instead of grounding the reference voltage terminal 19 and applying the fixed potentials thereto, the modulation signal Sin inputted to the input terminal 102 is voltage-divided by a second resistor R2 and a third resistor R3 and is then inputted the loop filter 18. In order to suppress the effect of the second resistor R2 on the frequency characteristics of the loop filter 18, it is preferable that the resistance value of the second resistor R2 be set to several ten ohms to several hundred ohms. Nevertheless, the second resistance R2 may be regarded as part of components of the loop filter 18. In such a case, it can be thought of as that the modulation signal Sin is inputted to a terminal, among terminals led from the loop filter 18, which is other than the terminals on a path leading from the output terminal 17 of the phase comparator 16 to the input terminal 13 of the VCO 12. The resistance value of the third resistor R3 is preferably several kilo ohms.

Nevertheless, the configuration of the loop filter 18 is not limited to that shown in FIG. 2. The loop filter 18 may be so configured as to obtain a desired cutoff frequency, but it must be provided on a path leading from the reference voltage terminal 19 to the input terminal 13 of the VCO 12 and contain a capacitor to block the DC components.

An operation of the frequency modulator 100 configured as above will now be described. The modulation signal Sin inputted from the input terminal 102 is voltage-divided by the second resistor R2 and the third resistor R3 and is then inputted to the loop filter 18 from the reference voltage terminal 19. The loop filter 18 functions as a high-pass filter for the signals inputted to the reference voltage terminal 19 and eliminates the DC components in the modulation signal Sin. In other words, the first capacitor C1 and the second capacitor C2 in the loop filter 18 function as coupling capacitances.

The loop filter 18 functions as a filter designed in the first place, namely as a low-pass filter, for the phase difference voltage Vpc outputted from the phase comparator 16.

The phase difference voltage Vpc outputted from the phase comparator 16 and the modulation signal Sin are superimposed by the loop filter 18 so as to be inputted to the input terminal 13 of the VCO 12 as the control signal Vcnt. As a result, the output signal Sout of the VCO 12 becomes a high-frequency signal which has been frequency-modulated by the modulation signal Sin.

In this manner, the frequency modulator 100 according to the present embodiment inputs the modulation signal Sin to the reference voltage terminal 19 of the loop filter 18 and superimposes this modulation signal Sin with the output signal of the phase comparator 16. As a result thereof, the provision of a coupling capacitor or the like is no longer necessary as compared with a conventional circuit. Hence the number of circuit components required can be reduced, the circuitry can be simplified and the circuit scale can be reduced. In particular, in the conventional practice there was a problem in which a coupling capacitor together with other circuit elements may form a high-pass filter. In such a case, in order to pass the necessary frequency components, the capacitance value thereof needs to be very large. Thus it is not possible to be integrated into an IC package and it needs to be provided as an outside component. In contrast to this, in the frequency modulator 100 according to the present embodiment the modulation signal Sin can be superimposed with the input of the VCO 12 in a PLL without the use of a coupling capacitor. Thus the outside components can be reduced. Also, two terminals need to be provided if the coupling capacitor is to be provided outside. According to the present embodiment, the number of such terminals required can be reduced and therefore the chip area can be reduced.

Figure 3:
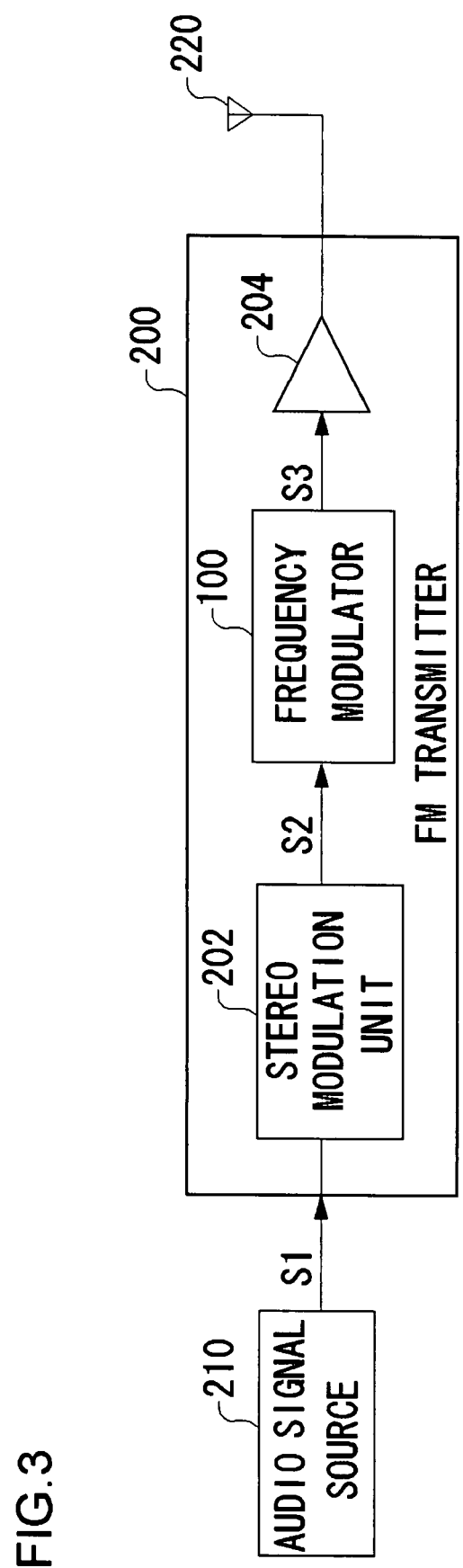
FIG. 3 is a block diagram showing a structure of an FM transmitter using the frequency modulator shown in FIG. 1 and FIG. 2.

A description is next given of an application of the frequency modulator 100 according to the present embodiment. FIG. 3 is a block diagram showing a structure of an FM transmitter 200 using the frequency modulator 100 shown in FIG. 1 and FIG. 2. This FM transmitter 200 converts an audio signal to a stereo composite signal, performs frequency modulation on the signal and amplifies it so as to be transmitted from an antenna. Such an FM transmitter 200 as this can be used to transmit the signal without the use of a cable. Or, it can be incorporated into a portable unit and can be used to transmit the audio signal to a stationary audio equipment. The FM transmitter 200 may be integrated into an LSI such that it includes a stereo modulation unit 202 and a power amplifier 204 in addition to the frequency modulator 100 of FIG. 2, or the FM transmitter 200 may be configured such that those components are divided into separate ICs.

The audio signal source 210 is a CD player, a MD player, a memory audio, a hard disk audio or the like, and it produces an audio signal S1 and then outputs it to the FM transmitter 200. The stereo modulation unit 202 converts the audio signal S1 to a stereo composite signal S2. The stereo composite signal S2 is inputted to the frequency modulator 100 of FIG. 2. The frequency modulator 100 performs frequency modulation based on the stereo composite signal S2 so as to output a modulated signal S3 (Sout). The modulated signal S3 outputted from the frequency modulator 100 is amplified by the power amplifier 204 so as to be transmitted from an antenna 220. Note that the major blocks of an FM transmitter 200 are shown in FIG. 3 in a simplified manner and other circuit blocks such a filter are omitted in FIG. 3.

The FM transmitter 200 shown in FIG. 3 is configured by using the frequency modulator 100 shown in FIG. 2, so that the number of circuit elements used is reduced and the reduced size can be achieved. As a result, the implementation thereof to small-sized electronic equipment such as a mobile phone unit is facilitated.

The above embodiments are merely exemplary and it is understood by those skilled in the art that various modifications to the combination of each component and process thereof are possible and such modifications are also within the scope of the present invention.

The circuit configuration of the loop filter 18 is not limited to the circuit shown in FIG. 2. For example, the configuration may be such that it functions, for the modulation signal Sin, as a high-pass filter that passes the audio band of greater than or equal to 10 to 20 Hz and it functions, for the phase difference voltage Vpc, as a filter having a band of a proper loop filter capable of removing several 10 kHz or more.

Though in the circuit of FIG. 2 a case is shown where the reference voltage terminal 19 is grounded via the second resistor R2 of a smaller resistance value. Besides this, the reference voltage terminal 19 may be connected to a terminal with less noise mixed therein.

In the present embodiments a description has been given of a case where the modulation signal Sin is inputted to the reference voltage terminal 19. Depending on how the loop filter 18 is configured, the modulation signal Sin may be inputted to a terminal led out of a point node which is different from the reference voltage terminal 19. In such a case, too, the loop filter 18 functions, for the modulation signal Sin, as a high-pass filter that passes the audio band of greater than or equal to 10 to 20 Hz and it also functions, for the phase difference voltage Vpc, as a filter having a band of a proper loop filter capable of removing several 10 kHz or more.

While the preferred embodiments of the present invention have been described using specific terms, such description is for illustrative purposes only, and it is to be understood that changes and variations may be further made without departing from the spirit or scope of the appended claims.

What is claimed is:

1. A frequency modulator, comprising:
    a voltage-controlled oscillator which oscillates at a frequency according to a voltage applied to an input terminal;
    a divider which divides an output signal of said voltage-controlled oscillator;
    a phase comparator which compares the output signal of said divider with a reference clock signal and outputs a voltage corresponding to a phase difference between the output signal thereof and the reference clock signal; and
    a loop filter, provided on a path leading from an output terminal of said phase comparator to the input terminal of said voltage-controlled oscillator, which removes a high-frequency component of an output voltage of said phase comparator,
    wherein a terminal for inputting a modulation signal is provided in said loop filter, separately from a terminal connected with the path leading from the output terminal of said phase comparator to the input terminal of said voltage-controlled oscillator; and
    wherein the modulation signal is a stereo composite signal.

2. A frequency modulator according to claim 1, wherein the terminal provided for inputting the modulation signal is a reference voltage terminal of said loop filter.

3. A frequency modulator according to claim 2, where said loop filter includes a shunt capacitor branched out toward the reference voltage terminal from the path leading from the output terminal of said phase comparator to the input terminal of said voltage-controlled oscillator.

4. A frequency modulator according to claim 2, where said loop filter is a lag-lead filter.

5. A frequency modulator according to claim 3, wherein said loop filter includes:
    a first capacitor one end of which is connected with a wire serving as a path between the output terminal of said phase comparator and the input terminal of said voltage-controlled oscillator and the other end of which is connected with the reference voltage terminal; and
    a second capacitor and a resistor provided in series on a path parallel to the first capacitor.

6. A frequency modulator according to claim 1, wherein said frequency modulator is integrated onto a single semiconductor substrate.

7. An FM transmitter circuit, comprising:
    a stereo modulation unit which converts an audio signal to a stereo composite signal;
    a frequency modulator which frequency-modulates the stereo composite signal, outputted from said stereo modulation unit, as a modulation signal; and
    an amplifier which amplifies a modulated signal outputted from said frequency modulator, said frequency modulator comprising:
- a voltage-controlled oscillator which oscillates at a frequency according to a voltage applied to an input terminal;
- a divider which divides an output signal of the voltage-controlled oscillator;
- a phase comparator which compares the output signal of the divider with a reference clock signal and outputs a voltage corresponding to a phase difference between the output signal thereof and the reference clock; and
- a loop filter, provided on a path leading from an output terminal of the phase comparator to the input terminal of the voltage-controlled oscillator, which removes a high-frequency component of an output voltage of the phase comparator, wherein a terminal for inputting a modulation signal is provided in the loop filter, separately from a terminal connected with the path leading from the output terminal of said phase comparator to the input terminal of the voltage-controlled oscillator.

* * * * *